(12) United States Patent
Pendse

(10) Patent No.: US 7,750,482 B2
(45) Date of Patent: Jul. 6, 2010

(54) INTEGRATED CIRCUIT PACKAGE SYSTEM INCLUDING ZERO FILLET RESIN

(75) Inventor: Rajendra D. Pendse, Fremont, CA (US)

(73) Assignee: Stats Chippac Ltd., Singapore (SG)

( * ) Notice: Subject to any disclaimer, the term of this patent is extended or adjusted under 35 U.S.C. 154(b) by 796 days.

(21) Appl. No.: 11/307,482

(22) Filed: Feb. 9, 2006

(65) Prior Publication Data

US 2007/0182018 A1    Aug. 9, 2007

(51) Int. Cl.
H01L 23/52 (2006.01)
H01L 23/48 (2006.01)
H01L 29/40 (2006.01)

(52) U.S. Cl. .............................. 257/778; 257/E27.137; 257/685; 257/723; 257/787

(58) Field of Classification Search .......... 257/E27.137, 257/E27.144, E27.161, 685, 686, 777, 787, 257/723; 438/108, 109; 361/760
See application file for complete search history.

(56) References Cited

U.S. PATENT DOCUMENTS

| 4,524,121 A | 6/1985 | Gleim et al. |
| 4,697,203 A | 9/1987 | Sakai et al. |
| 4,764,804 A | 8/1988 | Sahara et al. |
| 4,894,707 A | 1/1990 | Yamawaki et al. |
| 5,186,383 A | 2/1993 | Melton et al. |
| 5,214,307 A | 5/1993 | Davis .......................... 257/676 |
| 5,214,308 A | 5/1993 | Nishiguchi et al. |
| 5,222,014 A | 6/1993 | Lin |
| 5,229,960 A | 7/1993 | De Givry |
| 5,269,453 A | 12/1993 | Melton et al. |
| 5,340,771 A | 8/1994 | Rostoker |
| 5,373,189 A | 12/1994 | Massit et al. |
| 5,436,203 A | 7/1995 | Lin |
| 5,444,296 A | 8/1995 | Kaul et al. |
| 5,495,398 A | 2/1996 | Takiar et al. |
| 5,550,711 A | 8/1996 | Burns et al. |
| 5,579,207 A | 11/1996 | Hayden et al. |
| 5,607,227 A | 3/1997 | Yasumoto et al. |
| 5,650,667 A | 7/1997 | Liou |
| 5,652,185 A | 7/1997 | Lee |
| 5,734,199 A | 3/1998 | Kawakita et al. |

(Continued)

FOREIGN PATENT DOCUMENTS

EP        0 430 458 A2    6/1991

(Continued)

OTHER PUBLICATIONS

Kim, J. and Boruch, J., "Enabling a Microelectronic WorldTM", AMKOR Technology, Inc.2002 Annual Report, retrieved from Internet:<URL:http://media.corporate-ir.net/media_files/iro/11/115640/2002AnnualReport.pdf.

*Primary Examiner*—Chris C Chu
(74) *Attorney, Agent, or Firm*—Mikio Ishimaru

(57) ABSTRACT

An integrated circuit packaging system comprised by providing a substrate with a first surface including conductive regions for receiving a flip chip die and a second surface including electrical contacts for external electrical connections. Providing the flip chip die over the substrate. Depositing a controlled volume of resin between the first surface of the substrate and the flip chip die and adhering the flip chip die to the first surface of the substrate to form the controlled volume of resin into a zero fillet resin.

20 Claims, 2 Drawing Sheets

U.S. PATENT DOCUMENTS

| | | | |
|---|---|---|---|
| 5,744,863 A | 4/1998 | Culnane et al. | |
| 5,748,452 A | 5/1998 | Londa | |
| 5,760,478 A | 6/1998 | Bozso et al. | |
| 5,811,351 A | 9/1998 | Kawakita et al. | |
| 5,824,569 A | 10/1998 | Brooks et al. | |
| 5,828,128 A | 10/1998 | Higashiguchi et al. | |
| 5,854,507 A | 12/1998 | Miremadi et al. | |
| 5,898,219 A | 4/1999 | Barrow | |
| 5,899,705 A | 5/1999 | Akram | |
| 5,903,049 A | 5/1999 | Mori | |
| 5,963,430 A | 10/1999 | Londa | |
| 5,977,640 A | 11/1999 | Bertin et al. | |
| 5,977,641 A | 11/1999 | Takahashi et al. | |
| 5,982,633 A | 11/1999 | Jeansonne | |
| 5,994,166 A | 11/1999 | Akram et al. | |
| 6,025,648 A | 2/2000 | Takahashi et al. | |
| RE36,613 E | 3/2000 | Ball | |
| 6,034,875 A | 3/2000 | Heim et al. | |
| 6,075,289 A | 6/2000 | Distefano | |
| 6,083,775 A | 7/2000 | Huang et al. | |
| 6,083,811 A | 7/2000 | Riding et al. | |
| 6,101,100 A | 8/2000 | Londa | |
| 6,107,164 A | 8/2000 | Ohuchi | |
| 6,118,176 A | 9/2000 | Tao et al. | |
| 6,121,682 A | 9/2000 | Kim | |
| 6,130,448 A | 10/2000 | Bauer et al. | |
| 6,133,626 A | 10/2000 | Hawke et al. | |
| 6,143,588 A | 11/2000 | Glenn | |
| 6,144,507 A | 11/2000 | Hashimoto | |
| 6,157,080 A * | 12/2000 | Tamaki et al. | 257/738 |
| 6,165,815 A | 12/2000 | Ball | |
| 6,184,463 B1 * | 2/2001 | Panchou et al. | 174/558 |
| 6,201,266 B1 | 3/2001 | Ohuchi et al. | |
| 6,201,302 B1 | 3/2001 | Tzu | |
| 6,204,562 B1 | 3/2001 | Ho et al. | |
| 6,225,699 B1 | 5/2001 | Ference et al. | |
| 6,229,217 B1 * | 5/2001 | Fukui et al. | 257/777 |
| 6,238,949 B1 | 5/2001 | Nguyen et al. | |
| 6,242,932 B1 | 6/2001 | Hembree | |
| 6,246,123 B1 | 6/2001 | Landers, Jr. et al. | |
| 6,265,766 B1 | 7/2001 | Moden | |
| 6,266,197 B1 | 7/2001 | Glenn et al. | |
| 6,274,930 B1 | 8/2001 | Vaiyapuri et al. | |
| 6,291,263 B1 | 9/2001 | Huang | |
| 6,294,406 B1 | 9/2001 | Bertin et al. | |
| 6,297,131 B1 | 10/2001 | Yamada et al. | |
| 6,307,256 B1 * | 10/2001 | Chiang et al. | 257/668 |
| 6,316,735 B1 | 11/2001 | Higashiguchi | |
| 6,316,838 B1 | 11/2001 | Ozawa et al. | |
| 6,333,552 B1 | 12/2001 | Kakimoto et al. | |
| 6,340,846 B1 | 1/2002 | LoBianco et al. | |
| 6,353,257 B1 | 3/2002 | Huang | |
| 6,358,773 B1 | 3/2002 | Lin et al. | |
| 6,369,454 B1 | 4/2002 | Chung | |
| 6,372,551 B1 | 4/2002 | Huang | |
| 6,376,904 B1 | 4/2002 | Haba et al. | |
| 6,384,472 B1 | 5/2002 | Huang | |
| 6,388,313 B1 | 5/2002 | Lee et al. | |
| 6,396,116 B1 | 5/2002 | Kelly et al. | |
| 6,400,007 B1 | 6/2002 | Wu et al. | |
| 6,407,381 B1 | 6/2002 | Glenn et al. | |
| 6,407,456 B1 | 6/2002 | Ball | |
| 6,410,861 B1 | 6/2002 | Huang et al. | |
| 6,413,798 B2 | 7/2002 | Asada | |
| 6,414,381 B1 | 7/2002 | Takeda | |
| 6,420,204 B2 | 7/2002 | Glenn | |
| 6,420,244 B2 | 7/2002 | Lee | |
| 6,424,050 B1 | 7/2002 | Komiyama | |
| 6,441,496 B1 | 8/2002 | Chen et al. | |
| 6,445,064 B1 | 9/2002 | Ishii et al. | |
| 6,455,353 B2 | 9/2002 | Lin | |
| 6,462,421 B1 * | 10/2002 | Hsu et al. | 257/777 |
| 6,472,732 B1 | 10/2002 | Terui | |
| 6,489,676 B2 | 12/2002 | Taniguchi et al. | |
| 6,492,726 B1 | 12/2002 | Quek et al. | |
| 6,501,165 B1 | 12/2002 | Farnworth et al. | |
| 6,503,780 B1 | 1/2003 | Glenn et al. | |
| 6,509,639 B1 | 1/2003 | Lin | |
| 6,512,219 B1 | 1/2003 | Webster et al. | |
| 6,512,303 B2 | 1/2003 | Moden | |
| 6,529,027 B1 | 3/2003 | Akram et al. | |
| 6,534,419 B1 | 3/2003 | Ong | |
| 6,538,319 B2 | 3/2003 | Terui | |
| 6,541,857 B2 | 4/2003 | Caletka et al. | |
| 6,545,365 B2 | 4/2003 | Kondo et al. | |
| 6,545,366 B2 * | 4/2003 | Michii et al. | 257/777 |
| 6,552,423 B2 | 4/2003 | Song et al. | |
| 6,555,902 B2 | 4/2003 | Lo et al. | |
| 6,555,917 B1 | 4/2003 | Heo | |
| 6,566,745 B1 | 5/2003 | Beyne et al. | |
| 6,570,249 B1 | 5/2003 | Liao et al. | |
| 6,580,169 B2 | 6/2003 | Sakuyama et al. | |
| 6,580,173 B2 * | 6/2003 | Okada et al. | 257/774 |
| 6,583,503 B2 | 6/2003 | Akram et al. | |
| 6,590,281 B2 | 7/2003 | Wu et al. | |
| 6,593,647 B2 | 7/2003 | Ichikawa | |
| 6,593,648 B2 | 7/2003 | Emoto | |
| 6,593,662 B1 | 7/2003 | Pu et al. | |
| 6,599,779 B2 | 7/2003 | Shim et al. | |
| 6,607,937 B1 | 8/2003 | Corisis | |
| 6,610,563 B1 | 8/2003 | Waitl et al. | |
| 6,611,063 B1 | 8/2003 | Ichinose et al. | |
| 6,613,980 B1 | 9/2003 | McGhee et al. | |
| 6,617,198 B2 | 9/2003 | Brooks | 438/118 |
| 6,617,694 B2 * | 9/2003 | Kodaira et al. | 257/777 |
| 6,621,169 B2 | 9/2003 | Kikuma et al. | |
| 6,621,172 B2 | 9/2003 | Nakayama et al. | |
| 6,627,864 B1 | 9/2003 | Glenn et al. | |
| 6,627,979 B2 | 9/2003 | Park | |
| 6,642,609 B1 | 11/2003 | Minamio et al. | |
| 6,649,445 B1 | 11/2003 | Qi et al. | |
| 6,649,448 B2 | 11/2003 | Tomihara | |
| 6,650,019 B2 | 11/2003 | Glenn et al. | |
| 6,664,644 B2 * | 12/2003 | Morozumi | 257/777 |
| 6,667,556 B2 | 12/2003 | Moden | |
| 6,674,156 B1 | 1/2004 | Bayan et al. | |
| 6,690,089 B2 | 2/2004 | Uchida | |
| 6,692,993 B2 | 2/2004 | Li et al. | |
| 6,693,364 B2 | 2/2004 | Tao et al. | |
| 6,700,178 B2 | 3/2004 | Chen et al. | |
| 6,700,192 B2 | 3/2004 | Matsuzawa et al. | |
| 6,706,557 B2 | 3/2004 | Koopmans | |
| 6,707,140 B1 | 3/2004 | Nguyen et al. | |
| 6,713,366 B2 | 3/2004 | Mong et al. | |
| 6,716,670 B1 | 4/2004 | Chiang | |
| 6,734,539 B2 | 5/2004 | Degani et al. | |
| 6,734,552 B2 | 5/2004 | Combs et al. | |
| 6,734,569 B2 | 5/2004 | Appelt et al. | 257/783 |
| 6,737,750 B1 | 5/2004 | Hoffman et al. | |
| 6,740,980 B2 | 5/2004 | Hirose | |
| 6,746,894 B2 | 6/2004 | Fee et al. | |
| 6,747,361 B2 | 6/2004 | Ichinose | |
| 6,762,488 B2 | 7/2004 | Maeda et al. | |
| 6,777,796 B2 * | 8/2004 | Fujimoto et al. | 257/686 |
| 6,777,799 B2 | 8/2004 | Kikuma et al. | |
| 6,777,819 B2 | 8/2004 | Huang | |
| 6,781,241 B2 * | 8/2004 | Nishimura et al. | 257/777 |
| 6,784,023 B2 * | 8/2004 | Ball | 438/113 |
| 6,784,534 B1 | 8/2004 | Glenn et al. | |
| 6,787,915 B2 | 9/2004 | Uchida et al. | |
| 6,787,916 B2 | 9/2004 | Halahan | |
| 6,791,036 B1 | 9/2004 | Chen et al. | |
| 6,791,076 B2 | 9/2004 | Webster | |
| 6,794,741 B1 | 9/2004 | Lin et al. | |

| | | | | | | |
|---|---|---|---|---|---|---|
| 6,794,749 B2 | 9/2004 | Akram | | 7,176,506 B2 | 2/2007 | Beroz et al. |
| 6,809,405 B2 | 10/2004 | Ito et al. | | 7,183,191 B2 | 2/2007 | Kinsman et al. |
| 6,818,980 B1 | 11/2004 | Pedron, Jr. | | 7,218,005 B2 | 5/2007 | Tago |
| 6,828,665 B2 | 12/2004 | Pu et al. | | 7,221,059 B2 | 5/2007 | Farnworth et al. |
| 6,833,612 B2 | 12/2004 | Kinsman | | 7,298,045 B2 | 11/2007 | Fujitani et al. |
| 6,835,598 B2 | 12/2004 | Baek et al. | | 7,335,994 B2 | 2/2008 | Klein et al. |
| 6,838,761 B2 | 1/2005 | Karnezos | | 2001/0055834 A1 | 12/2001 | Lin |
| 6,847,105 B2 | 1/2005 | Koopmans | | 2002/0024124 A1 | 2/2002 | Hashimoto |
| 6,851,598 B2 | 2/2005 | Gebauer et al. | | 2002/0096755 A1 | 7/2002 | Fukui et al. |
| 6,861,288 B2 | 3/2005 | Shim et al. | | 2002/0100955 A1 | 8/2002 | Potter et al. |
| 6,861,683 B2 | 3/2005 | Rissing et al. | | 2002/0130404 A1 | 9/2002 | Ushijima et al. |
| 6,864,566 B2 | 3/2005 | Choi | | 2002/0151103 A1 * | 10/2002 | Nakamura et al. .......... 438/106 |
| 6,881,611 B1 | 4/2005 | Fukasawa et al. | | 2003/0008510 A1 | 1/2003 | Grigg et al. |
| 6,882,057 B2 | 4/2005 | Hsu | | 2003/0113952 A1 | 6/2003 | Sambasivam et al. |
| 6,890,798 B2 | 5/2005 | McMahon | | 2003/0153134 A1 | 8/2003 | Kawata et al. |
| 6,900,079 B2 | 5/2005 | Kinsman et al. | | 2004/0016939 A1 | 1/2004 | Akiba et al. |
| 6,900,528 B2 | 5/2005 | Mess et al. | | 2004/0061213 A1 | 4/2004 | Karnezos |
| 6,900,549 B2 | 5/2005 | Brooks ....................... 257/783 | | 2004/0108581 A1 * | 6/2004 | Li .............................. 257/678 |
| 6,906,415 B2 | 6/2005 | Jiang et al. | | 2004/0119153 A1 | 6/2004 | Karnezos |
| 6,906,416 B2 | 6/2005 | Karnezos | | 2004/0124540 A1 | 7/2004 | Chen et al. |
| 6,919,631 B1 * | 7/2005 | Hoffman et al. ............ 257/707 | | 2004/0166605 A1 | 8/2004 | Kuratomi et al. |
| 6,930,378 B1 | 8/2005 | St. Amand et al. | | 2004/0201087 A1 | 10/2004 | Lee |
| 6,930,396 B2 | 8/2005 | Kurita et al. | | 2004/0212096 A1 | 10/2004 | Wang |
| 6,933,598 B2 | 8/2005 | Karnezos | | 2004/0251530 A1 * | 12/2004 | Yamaji ....................... 257/686 |
| 6,946,323 B1 * | 9/2005 | Heo .......................... 438/109 | | 2004/0268286 A1 * | 12/2004 | New et al. ..................... 716/14 |
| 6,951,982 B2 | 10/2005 | Chye et al. | | 2005/0051882 A1 | 3/2005 | Kwon et al. |
| 6,972,481 B2 | 12/2005 | Karnezos | | 2005/0075053 A1 | 4/2005 | Jung |
| 7,034,387 B2 | 4/2006 | Karnezos | | 2005/0104183 A1 * | 5/2005 | Kuroda et al. ............... 257/686 |
| 7,034,388 B2 | 4/2006 | Yang et al. | | 2005/0140023 A1 * | 6/2005 | Kinoshita et al. ........... 257/778 |
| 7,045,887 B2 | 5/2006 | Karnezos | | 2006/0043556 A1 | 3/2006 | Su et al. |
| 7,049,691 B2 | 5/2006 | Karnezos | | 2006/0065958 A1 | 3/2006 | Tsao et al. |
| 7,053,476 B2 | 5/2006 | Karnezos | | 2006/0138631 A1 | 6/2006 | Tao et al. |
| 7,053,477 B2 | 5/2006 | Karnezos et al. | | 2006/0189033 A1 | 8/2006 | Kim |
| 7,057,269 B2 | 6/2006 | Karnezos | | 2006/0197209 A1 | 9/2006 | Choi et al. |
| 7,061,088 B2 | 6/2006 | Karnezos | | 2006/0244157 A1 | 11/2006 | Carson |
| 7,064,426 B2 | 6/2006 | Karnezos | | | | |
| 7,071,568 B1 | 7/2006 | St. Amand et al. | | FOREIGN PATENT DOCUMENTS | | |
| 7,081,678 B2 | 7/2006 | Liu | | EP | 0 652 630 A2 | 5/1995 |
| 7,084,500 B2 | 8/2006 | Swnson et al. | | JP | 05152505 A | 6/1993 |
| 7,090,482 B2 | 8/2006 | Tsukahara et al. | | JP | 2001223326 A | 8/2001 |
| 7,093,358 B2 | 8/2006 | Akram et al. | | KR | 2001068614 A | 7/2001 |
| 7,101,731 B2 | 9/2006 | Karnezos | | KR | 2004085348 A | 10/2004 |
| 7,109,574 B2 | 9/2006 | Chiu et al. | | WO | 98/50954 A1 | 11/1998 |
| 7,115,990 B2 | 10/2006 | Kinsman | | WO | 02/084716 A2 | 10/2002 |
| 7,119,427 B2 | 10/2006 | Kim | | WO | 03/032370 A2 | 4/2003 |
| 7,122,906 B2 | 10/2006 | Doan | | | | |
| 7,125,745 B2 * | 10/2006 | Chen et al. ................. 438/108 | | * cited by examiner | | |

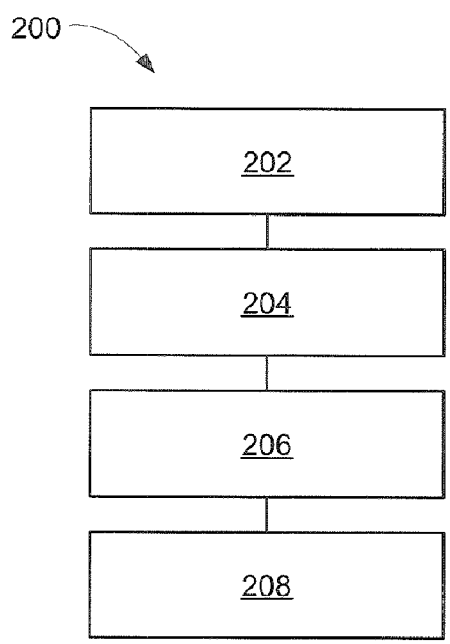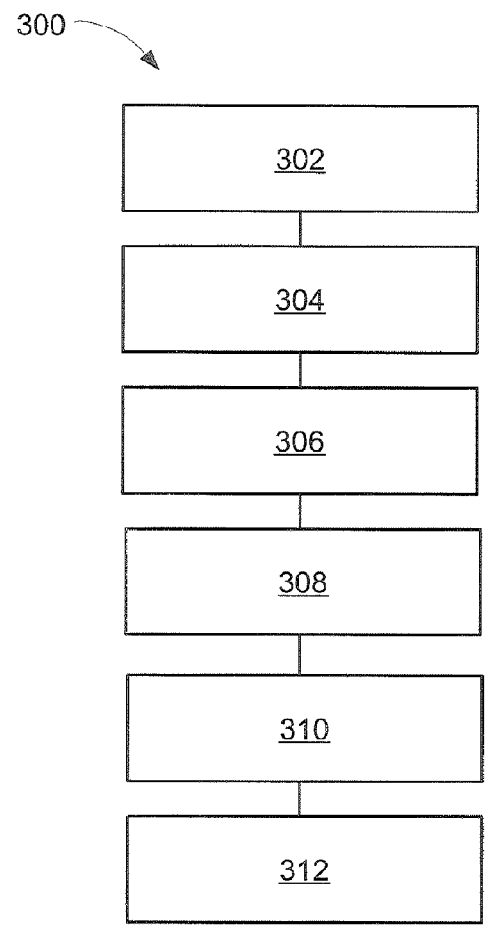

INTEGRATED CIRCUIT PACKAGE SYSTEM INCLUDING ZERO FILLET RESIN

TECHNICAL FIELD

The present invention relates generally to semiconductor packaging, and more particularly to an integrated circuit package system including a resin.

BACKGROUND ART

The future of packaging goals will be met by increasing the number of input/output (I/O) leads and the density of chips, while simultaneously reducing the number of internal connections and overall package size. Today's packaging with fewer interconnection links, decreases potential failure points, reduces circuit resistance and can shorten the circuit length, thereby enabling devices to operate at higher speeds. The need to create faster and more reliable integrated circuits, while reducing integrated circuit (IC) packaging size, is driven by consumer demand for these products in end-user applications, such as, cellphones, camcorders, portable music players, computers and televisions.

Flip chip packaging is an advanced IC packaging design that meets the demand for faster IC technology with more I/O leads. Flip chip packaging is a technique of mounting the active side of a chip toward the substrate (i.e.—upside down placement of the bumped die relative to wire-bonding techniques). This packaging technique is currently the design with the shortest path from the chip to the substrate, thereby providing a good electrical connection for high speed signals.

A common problem with flip chip technology is that the resin employed to reduce stresses arising from the excessive coefficient of thermal expansion (CTE) mismatch between the chip and the substrate is subject to bleed out or resin fillet formation. This resin bleed phenomena forms a fillet that spills out onto the bond finger region, thereby forcing the wire bond connection to the bond finger region to be laterally displaced so as to ensure a good electrical connection. This lateral displacement of the wire bond connection to the bond finger region causes an increase in package size.

The typical size of the resin fillet is about 1.5-3 mm, resulting in a lateral package size increase of 3-6 mm due to the resin fillet on both sides of the die. For a nominal package size of 12×12 mm, this would result in a package size increase of 25-50% and an increase in the package footprint (area) of 50-100% over what it would be if it were possible to connect within the resin fillet.

Thus, a need still remains for eliminating resin fillet formation and the corresponding increase in package size. In view of the semiconductor industry's demands, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit packaging system by providing a substrate with a first surface including conductive regions for receiving a flip chip die and a second surface including electrical contacts for external electrical connections. Depositing a controlled volume of resin between the first surface of the substrate and the flip chip die and adhering the flip chip die to the first surface of the substrate to form the controlled volume of resin into a zero fillet resin.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 2 is a flow chart for manufacturing a zero fillet resin integrated circuit packaging system in accordance with an embodiment of the present invention; and FIG. 3 is a flow chart for manufacturing a zero fillet resin integrated circuit packaging system in accordance with another embodiment of the present invention.

BEST MODE FOR CARRYING OUT THE INVENTION

Figure 1:
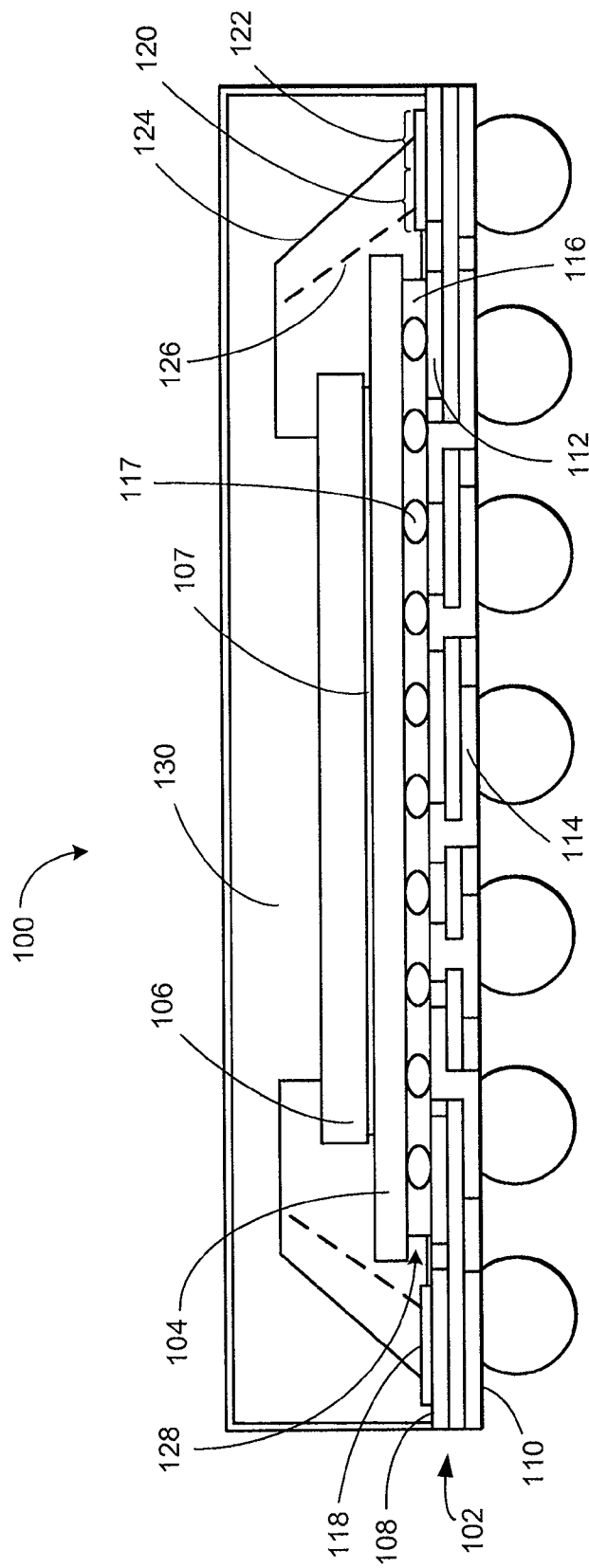
FIG. 1 is a side view of a zero fillet resin integrated circuit packaging system in accordance with an embodiment of the present invention.

The following embodiments are described in sufficient detail to enable those skilled in the art to make and use the invention, and it is to be understood that other embodiments would be evident based on the present disclosure and that process or mechanical changes may be made without departing from the scope of the present invention.

In the following description, numerous specific details are given to provide a thorough understanding of the invention. However, it will be apparent that the invention may be practiced without these specific details.

In order to avoid obscuring the present invention, some well-known system configurations, and process steps are not disclosed in detail. Likewise, the drawings showing embodiments of the invention are semi-diagrammatic and not to scale and, particularly, some of the dimensions are for the clarity of presentation and are shown exaggerated in the drawing FIGs.

The term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure. The term "on" means that there is direct contact among elements.

Referring now to FIG. 1, therein is shown a side view of a zero fillet resin integrated circuit packaging system 100 in accordance with an embodiment of the present invention. The integrated circuit package system 100 has a substrate 102, which may be a package substrate, a printed circuit board substrate, an integrated circuit die, or a silicon substrate. In one embodiment, a die such as a flip chip die 104, or a wire bond die in a further embodiment, is placed over the substrate 102, and a wire bond die 106 attached by a die attach adhesive 107 over the flip chip die 104. As an exemplary illustration, the flip chip die 104 can be a die selected from a digital signal processor (DSP), an application specific integrated circuit (ASIC) or a micro-processor die and the wire bond die 106 can be a die selected from an analog circuit or a memory die.

The substrate 102 has a first surface 108 and a second surface 110. The first surface 108 includes conductive regions 112 for receiving the flip chip die 104, and the second surface 110 includes electrical contacts 114 that connect to solder balls for external electrical connections.

Formed between the substrate 102 and the flip chip die 104 is a zero fillet resin 116. By way of example and not by way of limitation, the zero fillet resin 116 may be comprised by an epoxy or a resin. Additionally, by way of example and not by way of limitation, the zero fillet resin 116 material may reduce stresses arising from the excessive coefficient of thermal expansion (CTE) mismatch between the substrate 102 and the flip chip die 104, promote adhesion between the substrate 102 and the flip chip die 104, as well as, prevent the formation of a resin fillet. The resin material that makes up the zero fillet resin 116, can be pre-applied to the substrate 102 or to the flip chip die 104. In at least one embodiment, the zero fillet resin 116 can contact or encapsulate an interconnect 117 formed between the flip chip die 104 and the substrate 102. The controlled volume of the resin material, applied to form the zero fillet resin 116, is less than would be required to fill the volume of space between the substrate 102 and the flip chip 104 including the interconnects 117.

These resin fillet formations bleed out onto bond finger regions adjacent to the flip chip and obscure their surface, preventing electrical connections from subsequent wire bonding steps. Consequently, the wire bonds 124 are displaced laterally to regions on the bond fingers further away from the flip chips that are not covered by resin fillet formations. This lateral displacement of the wire bonds 124 to the bond finger regions causes an increase in package size.

Unlike previous methods and devices, the present invention forms a zero fillet resin 116. The hallmark of the zero fillet resin 116 is that it does not obscure a bond finger 118 located on the first surface 108 of the substrate 102. The bond finger 118, for ease of discussion, can be separated into two regions, a medial bond finger region 120 and a lateral bond finger region 122. The medial bond finger region 120 may be defined as the 50% of surface area of the bond finger 118 that is closest to the flip chip die 104 and the lateral bond finger region 122 may be defined as the 50% of surface area of the bond finger 118 that is furthest from the flip chip die 104.

Stated more explicitly, the zero fillet resin 116 should not obscure any portion of the medial bond finger region 120, thereby allowing a zero fillet wire bond 126 to be formed as close as technologically possible to the flip chip die 104. By forming the zero fillet wire bond 126 as close as technologically possible to the flip chip die 104, the size of the zero fillet resin integrated circuit packaging system 100 can be minimized by about 3.0 to 6.0 mm in a lateral direction.

With the advent of the present invention (i.e.—the zero fillet resin 116), the zero fillet wire bond 126 can be formed. The zero fillet wire bond 126 can be formed in the medial bond finger region 120 because the zero fillet resin 116 does not extend to the perimeter of the flip chip die 104 and cause a lateral displacement of the zero fillet wire bond 126.

Per an embodiment of the invention, the zero fillet resin 116 can leave a cavity 128 between the perimeter of the zero fillet resin 116 and the perimeter of the flip chip die 104. By way of illustration, the cavity 128 can be a region of about 1 mm in width free of resin. The cavity 128 is subsequently filled in later processing steps by a molding compound. It is to be understood that the formation of the cavity 128 is not a fundamental aspect of this invention.

While FIG. 1 depicts the zero fillet resin integrated circuit packaging system 100 comprised by the flip chip die 104 and the wire bond die 106, the zero fillet resin integrated circuit packaging system 100 may be comprised by a package-in-package (PiP) system or a package-on-package (PoP) system. The PiP system is a 3D package system that stacks a fully tested Internal Stacking Module (ISM) on top of a Base Assemble Package (BAP) to form a single Chip Scale Package (CSP). In terms of the invention, the BAP would act as the substrate 102 and the ISM would act as the flip chip die 104. PoP is a 3D package in which fully tested packages, such as single or stacked die fine ball grid array (FBGA) is stacked on top of another single or stacked FBGA during the board mount process. In terms of the invention, the board acts as the substrate 102 and the single or stacked die FBGA acts as the flip chip die 104.

After the zero fillet wire bond 126 is adhered to the medial bond finger region 120, a molding compound 130 is deposited over the IC package and fills the cavity 128. The zero fillet resin 116 can leave a width of about 3 mm around the periphery of the flip chip die 104, which will be filled by the molding compound 130. The molding compound 130 encapsulates and protects the integrated circuit package 100 from moisture, scratches, and contamination. The integrated circuit package 100 then undergoes a final electrical test to ensure IC quality.

Referring now to FIG. 2, therein is shown a flow chart of a method 200 for manufacturing a zero fillet resin integrated circuit packaging system in accordance with an embodiment of the present invention. The method 200 includes providing a substrate with a first surface including conductive regions for receiving a flip chip die and a second surface including electrical contacts for external electrical connections in a block 202; providing the flip chip die over the substrate in a block 204; depositing a controlled volume of resin between the first surface of the substrate and the flip chip die in a block 206; and adhering the flip chip die to the first surface of the substrate to form the controlled volume of resin into a zero fillet resin in a block 208.

Referring now to FIG. 3, therein is shown a flow chart of a system 300 for manufacturing a zero fillet resin integrated circuit packaging system in accordance with another embodiment of the present invention. The method 300 includes providing a substrate with a bond finger on a first surface and solder ball connections on a second surface in a block 302; providing a flip chip die in a block 304; depositing a controlled volume of resin between the first surface of the substrate and the flip chip die in a block 306; adhering the flip chip die to the first surface of the substrate to form the controlled volume of resin into a zero fillet resin in a block 308; routing a zero fillet wire bond connection to connect to the medial bond finger region closest to the flip chip die in a block 310; and depositing a molding compound in a block 312.

It has been discovered that the present invention thus has numerous aspects. An aspect is that the present invention results in miniaturization of the packaging system. By eliminating the resin fillet formation of the prior art, the wire bond connection to the bond finger can be routed closer to the flip chip die and correspondingly decrease the size of the package. Another aspect is that by reducing package size, less materials may be used and a concurrent cost savings is expected.

These and other valuable aspects of the present invention consequently further the state of the technology to at least the next level.

Thus, it has been discovered that the integrated circuit packaging system of the present invention furnishes important and heretofore unknown and unavailable solutions, capabilities, and functional advantages. For instance, by forming a zero fillet resin, the wire bond connection to the bond finger region can be made closer to the flip chip die, thereby decreasing the overall size of the package. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A method of manufacturing an integrated circuit package comprising:
   providing a substrate with a first surface including conductive regions for receiving a flip chip die and a second surface including electrical contacts for external electrical connections;
   providing the flip chip die over the substrate;
   depositing a controlled volume of resin between the first surface of the substrate and the flip chip die including applying the resin in a volume insufficient to fill the volume of space between the first surface of the substrate and the flip chip die; and
   adhering the flip chip die to the first surface of the substrate to form the controlled volume of resin into a zero fillet resin contacting an interconnect between the flip chip die and the substrate.

2. The method of claim 1 wherein:
   providing the flip chip die includes a die selected from digital signal processor die, application specific integrated circuit die, or micro-processor die.

3. The method of claim 1 wherein:
   depositing the controlled volume of resin includes depositing a volume of resin sufficient for assuring adhesion and preventing fillet formation.

4. The method of claim 1 further comprising:
   providing a wire bond die over the flip chip die.

5. The method of claim 1 wherein:
   manufacturing the integrated circuit package includes forming package-on-package systems or package-in-package systems.

6. A method of manufacturing an integrated circuit package comprising:
   providing a substrate with a bond finger on a first surface and solder ball connections on a second surface;
   providing a flip chip die;
   depositing a controlled volume of resin between the first surface of the substrate and the flip chip die including applying the resin in a volume insufficient to fill the volume of space between the first surface of the substrate and the flip chip die;
   adhering the flip chip die to the first surface of the substrate to form the controlled volume of resin into a zero fillet resin;
   routing a zero fillet wire bond connection to connect to the medial bond finger region closest to the flip chip die; and
   depositing a molding compound.

7. The method of claim 6 wherein:
   providing the substrate includes a substrate selected from printed circuit boards, package substrates, silicon substrates or integrated circuit die.

8. The method of claim 6 wherein:
   forming the zero fillet resin includes a perimeter region void of resin or filled by a molding compound between the substrate and the flip chip die of about 3 mm in width.

9. The method of claim 6 wherein:
   depositing a controlled volume of resin includes pre-applying the resin to the flip chip die or to the substrate.

10. The method of claim 6 wherein:
    manufacturing the integrated circuit package includes forming package-on-package systems or package-in-package systems.

11. An integrated circuit packaging system comprising:
    a flip chip die;
    a substrate with a first surface including conductive regions for receiving the flip chip die and a second surface including electrical contacts for external electrical connections; and
    a controlled volume of resin between the first surface of the substrate and the flip chip die, wherein the controlled volume of resin does not extend to the perimeter of the flip chip die, produces a zero fillet resin contacting an interconnect between the flip chip die and the substrate.

12. The system as claimed in claim 11 wherein:
    the flip chip die includes a die selected from digital signal processor die, application specific integrated circuit die, or micro-processor die.

13. The system as claimed in claim 11 wherein:
    the controlled volume of resin includes a volume of resin sufficient for assuring adhesion and preventing fillet formation.

14. The system as claimed in claim 11 further comprising:
    a wire bond die over the flip chip die.

15. The system as claimed in claim 11 wherein:
    the integrated circuit packaging system includes package-on-package systems or package-in-package systems.

16. The system as claimed in claim 11 wherein:
    the substrate includes a bond finger on the first surface and solder ball connections on the second surface;
    a zero fillet wire bond connection connected to a medial bond finger region closest to the flip chip die; and
    a molding compound that encapsulates the packaging system.

17. The system as claimed in claim 16 wherein:
    the substrate includes the substrate selected from printed circuit boards, package substrates, silicon substrates or integrated circuit die.

18. The system as claimed in claim 16 wherein:
    the zero fillet resin includes a perimeter region void of resin or filled with a molding compound between the substrate and the flip chip die in the range of 1 to 3 mm in width.

19. The system as claimed in claim 16 wherein:
    the controlled volume of resin is applied primarily to the flip chip die or to the substrate.

20. The system as claimed in claim 16 wherein:
    the integrated circuit package includes package-on-package systems or package-in-package systems.

* * * * *

UNITED STATES PATENT AND TRADEMARK OFFICE
CERTIFICATE OF CORRECTION

PATENT NO. : 7,750,482 B2  Page 1 of 1
APPLICATION NO. : 11/307482
DATED : July 6, 2010
INVENTOR(S) : Pendse It is certified that error appears in the above-identified patent and that said Letters Patent is hereby corrected as shown below:

Column 3

1. Between lines 20 and 21, the following [Para 20] from the specification was omitted.

Please insert the following:

--As mentioned above, the formation of a resin fillet due to resin bleed out causes an increase in package size, which is a direct contradiction of semiconductor manufacturing goals of miniaturization. The typical resin fillet formation can extend 1.5 to 3.0 mm out from the perimeter of a flip chip. This means that a cross-sectional dimension of a flip chip can increase by 3.0 to 6.0 mm after bleed out. For a nominal package size of 12 x 12 mm, this would result in a package size increase of 25-50% and an increase in the package footprint area by about 50-100%.--

Signed and Sealed this

Twenty-first Day of September, 2010

David J. Kappos
*Director of the United States Patent and Trademark Office*